United States Patent [19]

Müeller

[11] 4,063,273
[45] Dec. 13, 1977

[54] FUNDAMENTAL LOGIC CIRCUIT

[75] Inventor: Ruediger Müeller, Munich, Germany

[73] Assignee: Siemens Aktiengesellschaft, Berlin & Munich, Germany

[21] Appl. No.: 703,016

[22] Filed: July 6, 1976

[30] Foreign Application Priority Data

Sept. 2, 1975 Germany .............................. 2539967

[51] Int. Cl.² ...................... H01L 29/78; H01L 27/02
[52] U.S. Cl. ........................................ 357/43; 357/23; 357/41; 357/46
[58] Field of Search ...................... 357/23, 41, 43, 46

[56] References Cited

U.S. PATENT DOCUMENTS 3,639,787  2/1972  Lee ......................................... 357/43

Primary Examiner—Edward J. Wojciechowicz
Attorney, Agent, or Firm—Hill, Gross, Simpson, Van Santen, Steadman, Chiara & Simpson

[57] ABSTRACT

A logic circuit has the individual elements arranged in a semiconductor layer. The elements are in the form of field effect transistors having a multiple gate and bipolar transistors having a multiple emitter. The multiple gates of the field effect transistor represent the inputs of the fundamental logic circuit, and at least one emitter of the multiple emitters of the bipolar transistor represents the output of the fundamental logic circuit. The elements are arranged in the semiconductor layer in such a manner that a first supply voltage potential can be connected to the semiconductor layer. One configuration of the multiple gates of the field effect transistor identifies the circuit as a NAND circuit, while another configuration of the gates identifies the circuit as a NOR circuit. An additional element, a bipolar transistor, may be formed in the semiconductor layer and be connected to an emitter of the multiple emitter transistor to provide a power output stage in a Darlington configuration.

13 Claims, 7 Drawing Figures

FUNDAMENTAL LOGIC CIRCUIT

DESCRIPTION

The present invention relates to a fundamental logic circuit, and more particularly to a logic circuit in which the individual elements are arranged in a layer consisting of semiconductor material.

SUMMARY OF THE INVENTION

The object of the present invention is to provide a fundamental logic circuit which has a large integration density in comparison to corresponding known fundamental logic circuits.

This object is realized in a fundamental logic circuit, as generally mentioned above, in which the individual elements are in the form of a field effect transistor having multiple gates and a bipolar transistor having a multiple emitter. The multiple gates of the field effect transistor represent the inputs of the fundamental logic circuit, and at least one emitter of the multiple emitters of the bipolar transistor represents the output of the logic circuit. The elements are arranged in the semiconductor layer in such a manner that a first supply voltage potential can be connected to the semiconductor layer so that the layer functions as a collector of the bipolar transistor.

An essential advantage of a fundamental logic circuit constructed in accordance with the present invention resides in the fact that there is no longer a necessity for a mutual insulation of the individual components. In this manner it is possible to achieve the same packing density as in conventional MOS circuits.

Advantageously, fundamental logic circuits constructed in accordance with the principles of the present invention have a higher "fan out" than the corresponding fundamental circuits of the prior art. Here, "fan out" is to be understood as the possibility of making subsequent inputs.

A further advantage of logic circuits constructed in accordance with the invention resides in the fact that the possibility of input branching and output branching is greater than in arrangements heretofore known.

Advantageously, a fundamental logic circuit constructed in accordance with the principles of the present invention can be used to construct "NAND" gates and "NOR" gates, depending upon the arrangement of the multiple gate structures.

Another advantage of the present invention is that power stages having a Darlington output and an open emitter can be additionally integrated on the chip.

Also advantageously, the resistance to interference of the logic circuit constructed in accordance with the present invention is relatively high due to the high voltage level and the low output impedance offered thereby.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

The logic circuits of the present invention are constructed from MOS field effect transistors and bipolar transistors. The logic circuits possess the ability of input branching and output branching in order to realize logic functions. Here, the advantages of the high input impedance of MOS field effect transistors and the low output impedance of bipolar transistors are linked. Correspondingly, the gates possess a high fan out capability with a good resistance to interference.

Figure 1:
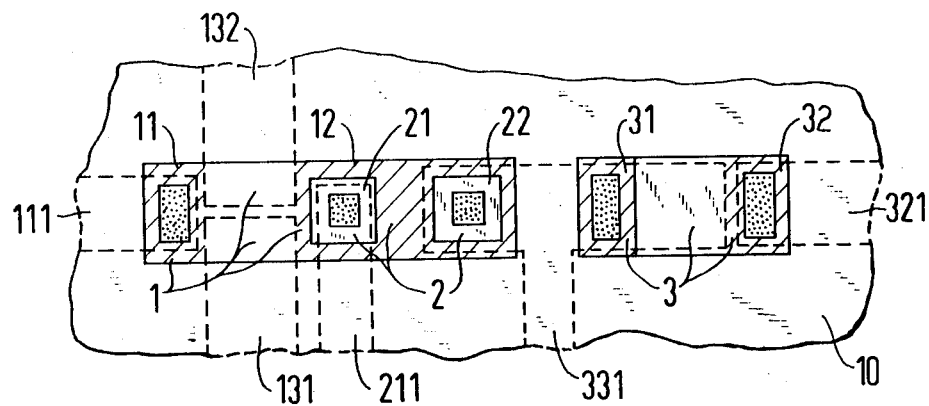
FIG. 1 is a schematic illustration of a plan view of a NAND gate constructed in accordance with the present invention.
Figure 2:
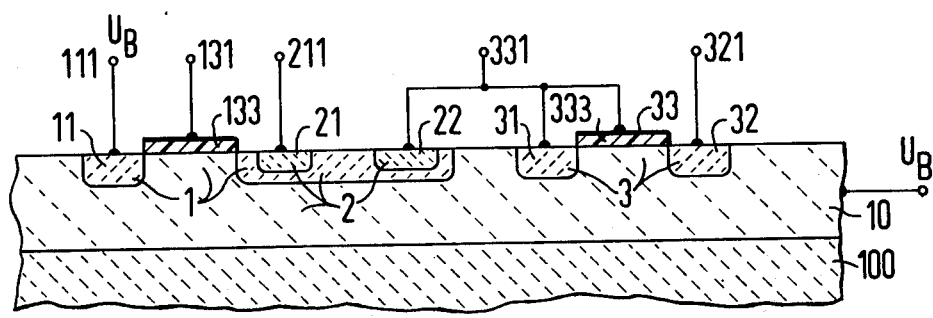
FIG. 2 is a cross sectional view taken through the NAND gate illustrated in FIG. 1.

First of all, the invention will be described on the basis of the construction of a NAND gate as illustrated in FIGS. 1 and 2, and as schematically illustrated and further supplemented in FIG. 3. Details of FIG. 1 which also occur in FIG. 2 (and in FIG. 3) bear corresponding reference characters.

The fundamental logic circuit comprises a transistor 1, a transistor 2 and a transistor 3. The transistor 1 and 3 are, for example, p-channel MOS field effect transistors. The transistor 2 is a vertical npn transistor having two emitters. The transistor 1, which is preferably of the enhancement type, and which is arranged, for example, in a n-doped layer 10, the layer 10 preferably applied to a n+ doped buried layer 100, has a p-doped source zone 11 and a likewise p-doped drain zone 12. Here, the source zone 11 is connected to a terminal 111.

As can be seen in particular from FIG. 1, a plurality, here two, gate electrodes 131 and 132 are arranged above the surface between the source zone 11 and the drain zone 12 of the transistor 1, being separated from the layer 10 by an insulating layer 133 which is preferably a $SiO_2$ layer. The transistor 1 is conductive when one of the two gate electrodes 131 and 132 is connected to a gate voltage which produces and maintains an enhancement layer beneath that electrode, each electrode extending over the length of a channel zone between the source zone 11 and the drain zone 12.

The p-doped drain zone 12 of the transistor 1 simultaneously represents the base of the bipolar npn transistor 2 which has multiple emitters, here the emitters 21 and 22. The emitter zone 21 of the transistor 2 and the emitter zone 22 of the transistor 2 are diffused in the p-doped zone 12. The emitter zones 21 and 22 are n-doped. The zone 21 is connected to a terminal 211 and the zone 22 is connected to a terminal 331. The n-doped layer 10 is preferably connected to the supply voltage $U_B$ and simultaneously represents the collector zone of the transistor 2.

The terminal 331 is also connected to a p-doped source zone 31 of the transistor 3 and to a gate terminal 33 of the transistor 3. A terminal 331 is connected to a p-doped drain zone 32 of the transistor 3, and preferably presents ground potential thereto.

Figure 3:
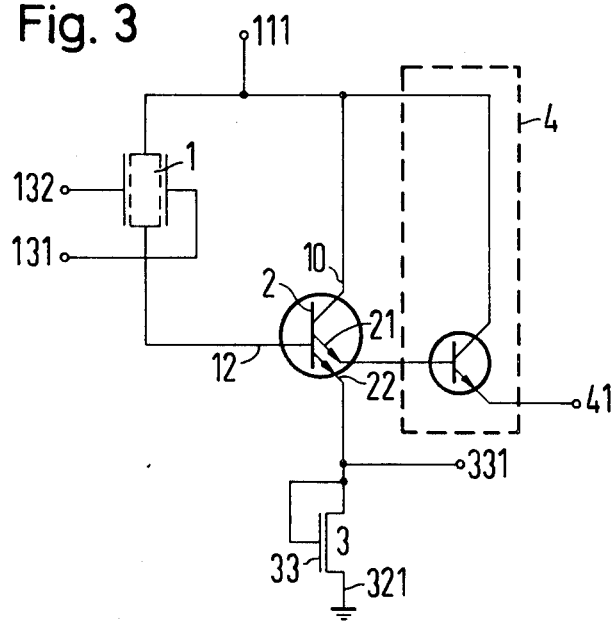
FIG. 3 is a schematic circuit diagram of a NAND gate having a normal output and a power output with an open emitter and corresponding to the structure illustrated in FIGS. 1 and 2.

The cross sectional view illustrated in FIG. 2 of this fundamental logic circuit corresponds to the circuit diagram in FIG. 3, with the exception of an additional transistor 4 which is illustrated in FIG. 3. The NAND gate operates as follows. When a signal having a high level (H) is present at the inputs 131 and 132, the enhancement type transistor 1 becomes blocked. This causes the bipolar transistor 2 to become blocked and, in this way, causes a signal with a low level (L) to be connected to the output 331. If a signal L is present at one of the inputs 131 or 132, the transistor 1 becomes conductive, which causes the operating voltage $U_B$ connected to the terminal 111, reduced by the voltage drop across the transistor 1, to reach the base 12 of the transistor 2. Consequently, the transistor 2 is placed into the conductive state and the signal H passes to the output 331.

The construction of a logic circuit, according to the present invention, means that it is unnecessary to insulate the individual transistors 1, 2 and 3 from one another, as the n-epitaxial layer 10 is permanently connected to the potential $+U_B$. In this manner, it is possible to achieve higher integration densities. The space requirement in repsect of each gate can be approximately 1500 $\mu m^2$.

By integrating a further npn transistor 4 (FIG. 3) in the semiconductor layer 10 it is possible to produce a power output 41 as a Darlington stage having an open emitter.

Preferably, the load transistor 3 is designed as a p-channel MOS transistor of the depletion type, as it is in this manner that it is possible to reach the fastest switching times.

Figure 4:
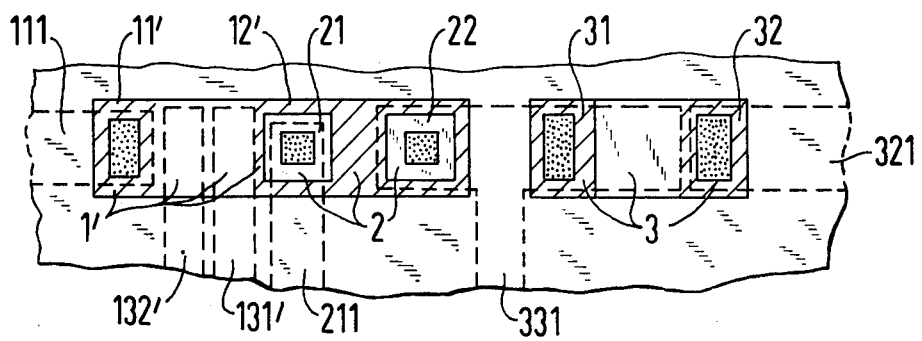
FIG. 4 is a schematic plan view of a NOR gate constructed in accordance with the present invention.
Figure 5:
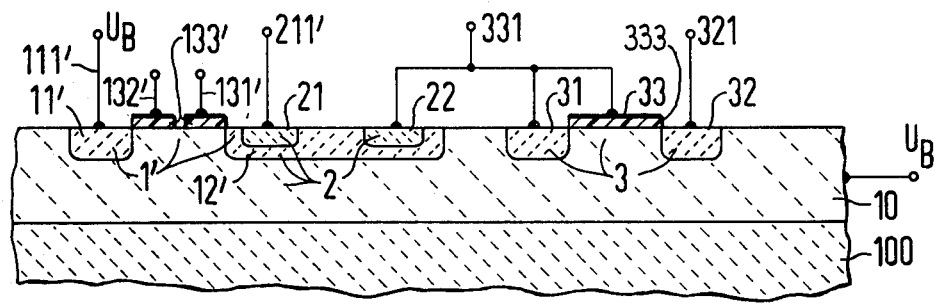
FIG. 5 is a cross sectional view taken through the NOR gate illustrated in FIG. 4.

The construction of a NOR gate will now be described with reference to FIGS. 4 and 5, and also reference to FIG. 6. Details of these figures which have already been described in association with FIGS. 1–3, bear corresponding reference characters. The fundamental NOR logic circuit comprises a transistor 1', a transistor 2 and a transistor 3. The transistor 1' and 3 are, for example, p-channel MOS field effect transistors. The transistor 2 is a vertical npn transistor having two emitters. The transistor 1', which is preferably of the enhancement type, and which is arranged, for example, in the n-doped layer 10, possesses a p-doped source zone 11', and likewise a p-doped drained zone 12'. Here, the source zone 11' is connected to a terminal 111'. As can be seen in particular in FIG. 4, two gate electrodes 131' and 132' are arranged above the surface between the source zone 11' and the drain zone 12' of the transistor 1' and are separated from the layer 10 by an insulating layer 133' which is preferably a SiO$_2$ layer. The transistor 1' becomes conductive when both of the gate electrodes 131' and 132' are connected to a gate voltage which produces a p channel beneath each gate electrode, as it can be seen from FIGS. 4 and 5 (and is illustrated in FIG. 6) that each electrode covers only a portion of a combined channel zone between the source 11' and the drain 12'.

The p-doped drain zone 12' of the transistor 1' again represents the base of the bipolar npn transistor 2 having multiple emitters. The emitter zone 21 of the transistor 2 and the emitter zone 22 of the transistor 2 are doped in this p-doped zone 12'. These zones 21 and 22 are n-doped. The zone 21 is connected to the terminal 211 and the zone 22 is connected to the terminal 331. The n-doped layer is connected to the supply voltage $U_B$ and simultaneously represents the collector zone of the transistor 2.

The terminal 331 is also connected to the p-doped source zone 31 of the transistor 3 and to the gate terminal 33 of the transistor 3, the gate terminal being separated from the layer 10 by the insulating layer 333 which preferably consists of SiO$_2$. The terminal 321 of the p-doped drain zone 32 of the transistor 3 is preferably connected to ground.

Figure 6:
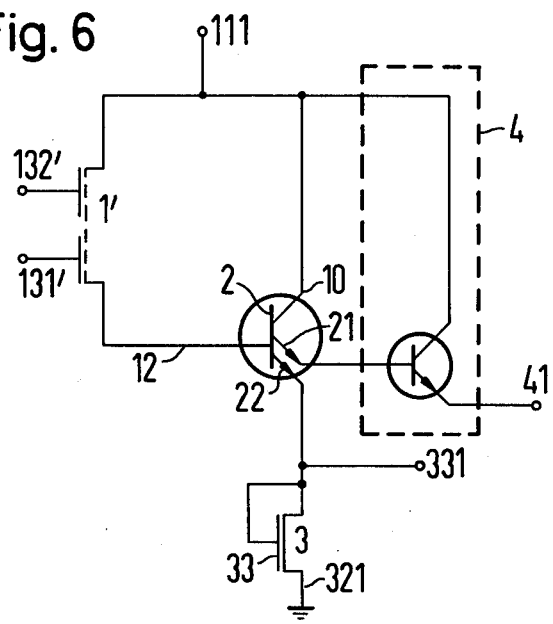
FIG. 6 is a schematic circuit diagram of a NOR gate having a normal output and a power output with an open emitter for the NOR gate illustrated in FIGS. 4 and 5.

The fundamental circuit diagram of this NOR gate corresponds to the circuit diagram illustrated in FIG. 6, with the exception of the additional transistor 4. The NOR gate functions as follows. When a low level signal L is present at the inputs 131' and 132', the enhancement type transistor 1' becomes conductive. This causes the bipolar transistor 2 to be rendered conductive and, in this way, causes a high level signal H to be connected to the output 331. If a high level signal H is present only at one of the inputs 131' or 132', the transistor 1' is blocked and prevents the operating voltage $U_B$ connected to the terminal 111 from reaching the base 12' of the transistor 2. The transistor 2 is thereby blocked and the signal L is connected to the output 331.

The potential barrier which occurs in this circuit due to the gap between the electrodes 131' and 132' can, for example, as known from CCD arrangements, be reduced by ion implantation, or by the use of a Si-Al gate technology.

Preferably, the load transistor 3 is again in the form of a p-channel MOS transistor of the depletion type, as it is in this way that the shortest switching times can be achieved.

By integrating a further npn transistor 4 (FIG. 6) it is again possible to produce power outputs as Darlington stages having an open emitter.

The advantages described in association with the NAND gate also apply to the fundamental circuit as constructed as a NOR gate.

Logic circuits having n-channel field effect transistors and vertical pnp transistors can also be constructed in accordance with the present invention. In this case, the dopings quoted in the above circuit examples should, in each case, be replaced by the opposite dopings and the voltages quoted therein should be replaced by voltages of the opposite polarity.

Figure 7:
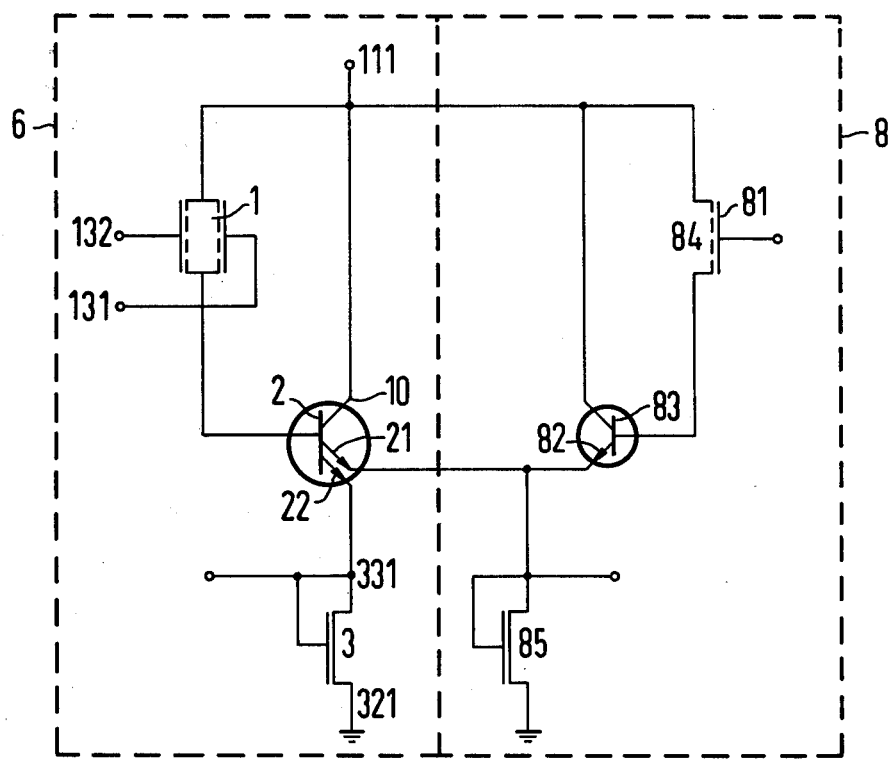
FIG. 7 is a schematic circuit diagram of a NAND gate having two inputs, and having three inputs, the gate being constructed in accordance with the principles of the present invention.

Further circuit variations can be achieved if two fundamental circuits constructed in accordance with the present invention operate on a common load. As an example, FIG. 7 illustrates such a circuit which comprises a NAND gate as described above, and an inverter 8. Here, the inverter 8 corresponds to the fundamental logic circuit illustrated in FIG. 3, where the transistor 84 possesses a single gate electrode 81 and the transistor 83 has a single emitter 82. The transistor 85 represents the load element which is common to the circuits 6 and 8. Details of FIG. 7 which have already been described in association with the other structures have been correspondingly referenced.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A logic circuit comprising:
   a semiconductor layer having a terminal for receiving a supply potential; and
   a plurality of circuit elements carried by said semiconductor layer defining
   a multiple gate field effect transistor the gates of which represent the logic inputs of said logic circuit, and
   a multiple emitter bipolar transistor integrated with said field effect transistor, at least one of the emitters representing the output of said logic circuit.

2. A logic circuit according to claim 1, wherein said plurality of circuit elements further define
   another field effect transistor having a gate connected to another of the emitters of said multiple emitter bipolar transistor, and a source-drain path connected between said other emitter and a reference potential.

3. A logic circuit comprising:
   a doped semiconductor layer;
   a terminal carried by said layer for receiving a first voltage supply potential;
   first and second zones doped oppositely to said semiconductor layer and spaced apart therein to have a channel zone therebetween and define a source and drain, respectively, of a MOS field effect transistor;
   an insulating layer carried by said semiconductor layer over the channel zone between said source and drain;
   a plurality of gate electrodes for the MOS field effect transistor carried on said insulating layer insulated from each other and arranged in a pattern in which each covers a respective portion of the channel zone such that application of a voltage which is effective to form the channel requires application of the suitable voltage to at least one of said gate electrodes, said plurality of electrodes constituting the logic inputs of said logic circuit;
   third and fourth zones doped oppositely to said second zone and spaced apart therein, said zone also constituting a base and said third and fourth zones consituting emitters and said semiconductor layer constituting the collector of a bipolar transistor, at least one of said emitters constituting an output for said logic circuit; and
   a load element in said semiconductor layer connected to said output and including a terminal for receiving a second voltage supply potential.

4. The logic circuit of claim 3, wherein said plurality of gate electrodes comprises a pair of gate electrodes each extending the length of the channel zone across the spacing between said first and second doped zones so that the application of said suitable voltage to either of the electrodes will effect channel formation of said logic circuit thereby operates as a NAND circuit.

5. The logic circuit of claim 3, wherein said load element is in the form of a MOS transistor comprising:
   fifth and sixth zones doped oppositely to the semiconductor layer and spaced apart therein as a source and a drain, respectively, said source connected to said output emittter and said drain carrying said terminal which receives the second voltage supply potential;
   another insulating layer carried on said semiconductor layer between said fifth and sixth zones; and
   another gate carried on the last-mentioned insulating layer and connected to said output emitter.

6. The logic circuit of claim 3, comprising: a further bipolar transistor including
   a collector constituted by said semiconductor layer,
   a fifth zone in and doped oppositely to said semiconductor layer constituting a base and electrically connected to one of said emitters of the multiple emitter first-mentioned bipolar transistor, and
   a sixth zone in and doped oppositely to said fifth zone constituting an emitter,
   said further bipolar transistor represented a Darlington stage.

7. The logic circuit of claim 3, comprising:
   another logic circuit integrated in said semiconductor layer and connected in common to said load element.

8. The logic circuit of claim 3, comprising:
   a buried layer carrying said semiconductor layer, said buried layer doped with the same conductivity as and to a greater degree than said semiconductor layer.

9. The logic circuit of claim 3, wherein each of said gate electrodes extends over a portion of the distance between said first and second doped zones such that all of said gate electrodes receive the suitable voltage to effect channel formation and said logic circuit thereby operates as a NOR circuit.

10. The logic circuit of claim 9, comprising:
    ion implanted charge carriers in said semiconductor layer beneath the spaces between said gate electrodes to avoid potential barriers between the gate electrodes.

11. The logic circuit of claim 9, wherein said gate electrodes are constructed in Si-Al technique to avoid potential barriers between the gate electrodes.

12. A logic circuit comprising:
    an n-doped semiconductor layer;
    a terminal carried by said layer for receiving a first voltage supply potential;
    first and second p-doped zones spaced apart in said semiconductor layer and having a channel zone therebetween and define a source and drain, respectively, of a MOS field effect transistor;
    an insulating layer carried by said semiconductor layer over the channel zone between said source and drain;
    a plurality of gate electrodes for the MOS field effect transistor carried on said insulating layer insulated from each other and arranged in a pattern in which each covers a respective portion of the channel zone such that application of a voltage which is effective to form the channel requires application of the suitable voltage to at least one of said gate electrodes, said plurality of electrodes constituting the logic inputs of said logic circuit;
    third and fourth n-doped zones spaced apart in said second zone, said second zone also constituting a base and said third and fourth zones constituting emitters and said semiconductor layer constituting the collector of a bipolar transistor, at least one of said emitters constituting an output for said logic circuit; and a load element in said semiconductor layer connected to said output and including a terminal for receiving a second voltage supply potential.

13. A logic circuit comprising:

a p-doped semiconductor layer;

a terminal carried by said layer for receiving a first voltage supply potential;

first and second n-doped zones spaced apart in said semiconductor layer and having a channel zone therebetween and define a source and drain, respectively, of a MOS field effect transistor;

an insulating layer carried by said semiconductor layer over the channel zone between said source and drain;

a plurality of gate electrodes for the MOS field effect transistor carried on said insulating layer insulated from each other and arranged in a pattern in which each covers a respective portion of the channel zone such that application of a voltage which is effective to form the channel requires application of the suitable voltage to at least one of said gate electrodes, said plurality of electrodes constituting the logic inputs of said logic circuit;

third and fourth p-doped zones spaced apart in said second zone, said second zone also constituting a base and said third and fourth zones constituting emitters and said semiconductor layer constituting the collector of a bipolar transistor, at least one of said emitters constituting an output for said logic circuit; and a load element in said semiconductor layer connected to said output and including a terminal for receiving a second voltage supply potential.

* * * * *